(12) United States Patent
Nakama

(10) Patent No.: US 6,373,606 B1
(45) Date of Patent: Apr. 16, 2002

(54) OPTICAL DEMULTIPLEXER

(75) Inventor: Kenichi Nakama, Osaka (JP)

(73) Assignee: Nippon Sheet Glass Co., Ltd. (JP)

( * ) Notice: Subject to any disclaimer, the term of this patent is extended or adjusted under 35 U.S.C. 154(b) by 0 days.

(21) Appl. No.: 09/437,953

(22) Filed: Nov. 10, 1999

Related U.S. Application Data

(63) Continuation of application No. PCT/JP99/01193, filed on Mar. 11, 1999.

(30) Foreign Application Priority Data

Mar. 11, 1998  (JP) ............................................. 10-078414

(51) Int. Cl.[7] .............................................. H04J 14/02
(52) U.S. Cl. ....................................... 359/130; 359/131
(58) Field of Search ................................ 359/124, 128, 359/130, 193, 131

(56) References Cited

U.S. PATENT DOCUMENTS

| 4,817,072 A | * | 3/1989 | Toide et al. | ............. | 369/44.37 |
| 6,011,884 A | * | 1/2000 | Dueck et al. | ............... | 359/130 |

FOREIGN PATENT DOCUMENTS

| JP | 57-29005 A | 2/1982 | ............. G02B/5/14 |
| JP | 1-120106 | 8/1989 | ............. G02B/6/25 |
| JP | 07030485 A | 1/1995 | ........... H04B/10/02 |
| JP | 08005861 A | 1/1996 | ............ G02B/6/293 |
| JP | 08075948 A | 3/1996 | ............ G02B/6/293 |
| JP | 08086932 A | 4/1996 | ............ G02B/2/293 |
| JP | 09073020 A | 3/1997 | ............. G02B/6/12 |
| JP | 09243855 A | 9/1997 | ............ G02B/6/293 |

OTHER PUBLICATIONS

"20–Channel Micro–Optic Grating Demultiplexer for 1.1–1.6 Band Using a Small Focusing Parameter Graded–Indx Rod Lens", Electronics Letters, 18(6), pp. 257–258, (Mar. 1982).

Kobayashi, K., et al., "Microoptic Grating Multiplexers and Optical Isolators for Fiber–Optic Communications", IEEE—Journal of Quantum Electronics, QE–16(1), pp. 11–22, (Jan. 1980).

Lipson, J., et al., "A Six–Channel Wavelength Multiplexer and Demultiplexer For Single Mode Systems", Journal of Lightwave Technology, LT–3 (5), pp. 1159–1163, (Oct. 1985).

Musahiro, O., et al., "Thermally stable Littrow mounted optical wavelength MUX", Technical Report of the Institute of Electronics, Information, and Communication Engineers, pp. 27–32, (1995).

McMahon, D.H., et al., "Echelon grating multiplexers for hierarchically multiplexed fiber–optic communications networks", Applied Optics, 26(11), pp. 2188–2196, (Jun. 1987).

* cited by examiner

Primary Examiner—Jason Chan
Assistant Examiner—Christina Y Leung
(74) Attorney, Agent, or Firm—Schwegman, Lundberg, Woessner & Kluth, P.A.

(57) ABSTRACT

An optical demultiplexer has an optical fiber, a single collimator lens, a diffraction grating, and an array of photodetectors. A light beam emitted from the optical fiber is demultiplexed by the collimator lens and the diffraction grating into light beams, and the light beams are focused by the collimator lens as beam spots deformed due to an aberration of an optical system of the optical demultiplexer onto the photodetectors. The photodetectors are arranged to accommodate and detect all the deformed focused beam spots. The array of photodetectors comprises a linear array of photodetectors or a matrix of photodetectors.

19 Claims, 4 Drawing Sheets

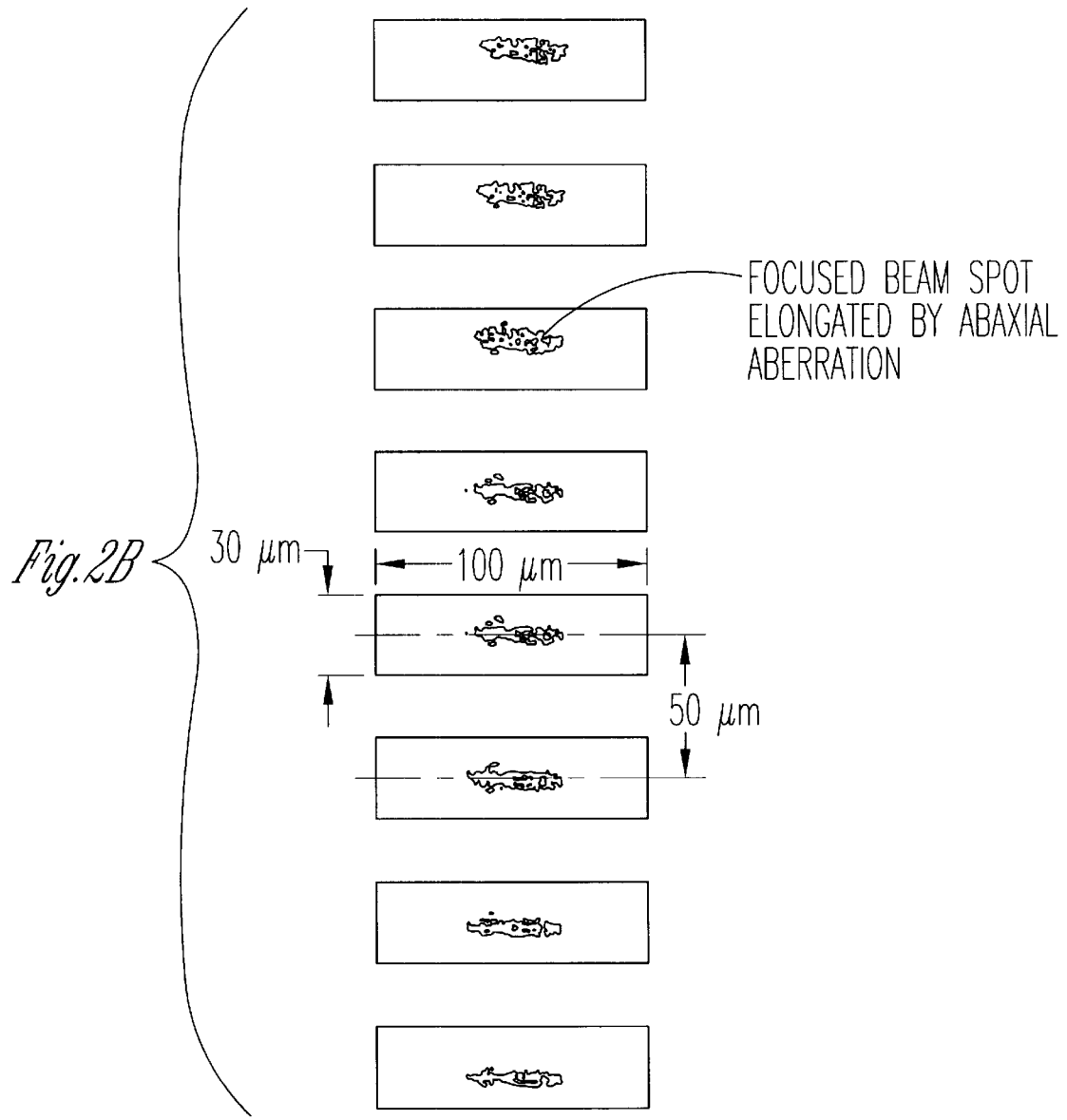

OPTICAL DEMULTIPLEXER

This appln is a continuation of PCT/JP99/01193 filed Mar. 11, 1999.

TECHNICAL FIELD

The present invention relates to an optical demultiplexer primarily for use in wavelength division multiplex optical communications.

BACKGROUND ART

Conventional optical demultiplexers for use in wavelength division multiplex optical communications include an optical demultiplexer having optical fibers as input and output mediums as disclosed in Japanese laid-open patent publication No. 9-243855, an optical demultiplexer having an optical fiber as an input medium and an optical waveguide as an output medium as disclosed in Japanese laid-open patent publication No. 8-75948, and an optical demultiplexer having an optical fiber as an input medium and a photodetector array as an output medium as disclosed in Japanese laid-open patent publication No. 7-30485.

In the case where optical fibers are used as input and output mediums, since a focused beam spot tends to be deformed due to an abaxial aberration, etc. and the spacing between the optical fibers cannot be smaller than the outside diameter thereof, the light beam has to be focused off the axis of the optical fiber entrance surface. As a result, a large coupling loss is caused, and the loss suffers a large variation due to a slight positional displacement of the focused position. It is thus difficult to achieve an optical demultiplexer having a reduced loss and capable of operating stably.

In the case where an optical fiber is used as an input medium and an optical waveguide as an output medium, it is possible to considerably reduce the magnitude of a coupling loss caused by an abaxial aberration. However, because the spacing between adjacent channels is reduced, interchannel crosstalk is increased, resulting in a reduction in multiplexing performance.

Japanese laid-open patent publication No. 7-30485 discloses use of an optical fiber as an input medium and a photodetector array as an output medium, and the processing of crosstalk arising between adjacent channels with a neural network circuit connected to the photodetector array. However, this arrangement is problematic in that the module structure is complex and highly expensive. Since the disclosed optical demultiplexer does not incorporate the idea of correcting an abaxial aberration in the optical system, but is based on the design concept of processing an output signal from the simply arranged photodetector array with a logic circuit, no countermeasures are taken against a coupling loss, and the logic circuit is relied on to reduce crosstalk. Accordingly, the disclosed optical demultiplexer is poorer than aberration-corrected systems.

It is therefore an object of the present invention to solve the above problems of a coupling loss due to an abaxial aberration, etc. with an arrangement not based on optical design approaches.

Specifically, it is an object of the present invention to provide an optical demultiplexer having a photodetector array which comprises photodetectors that are shaped and arranged in special ways.

DISCLOSURE OF THE INVENTION

To achieve the above objects, there is provided in accordance with the present invention an optical demultiplexer having an optical fiber, a single collimator lens, a diffraction grating, and an array of photodetectors, characterized in that a light beam emitted from the optical fiber is demultiplexed by the collimator lens and the diffraction grating into light beams, and the light beams are focused by the collimator lens as beam spots deformed due to an aberration of an optical system of the optical demultiplexer onto the photodetectors, and said photodetectors are arranged to accommodate and detect all the deformed focused beam spots.

The array of photodetectors comprises a linear array of photodetectors. Particularly, the array of photodetectors comprises a linear array of as many photodetectors as the number of demultiplexed channels in a direction in which the light beam is demultiplexed by said diffraction grating, and if it is assumed that said diffraction grating has a diffraction order of m and a diffraction constant d, the center-to-center distance between adjacent ones of said photodetectors along the array of the photodetectors is represented by p, the focal length of said collimator lens is represented by f, the used wavelength is represented by $\lambda_0$, and the wavelength interval between the demultiplexed channels is represented by $\Delta\lambda$, then the center-to-center distance p between adjacent ones of the photodetectors along the array of the photodetectors satisfies the following equation:

$$p = mf\Delta\lambda/(d\sqrt{(1-(m\lambda_0/(2d))^2)})$$

and wherein the width Wy of said photodetectors along the array thereof ranges from 0.2 p to 0.9 p and the width Wx of said photodetectors in a direction perpendicular to the array thereof ranges from 1 Wy to 10 Wy.

The array of photodetectors may comprise a matrix of photodetectors. Particularly, the array of photodetectors may comprise a matrix of photodetectors in 1 rows×k columns, and if it is assumed that the number of demultiplexed channels in the direction in which the light beam is demultiplexed by said diffraction grating is represented by n, then α is defined as α=(k·cosθ)/n (θ represents an angle formed between the direction in which the light beam is demultiplexed and scattered and the direction of the k columns), and if it is assumed that said diffraction grating has a diffraction order of m and a diffraction constant d, the center-to-center distance between adjacent ones of said photodetectors along the array of the photodetectors is represented by p, the focal length of said collimator lens is represented by f, the used wavelength is represented by $\lambda_0$, and the wavelength interval between the demultiplexed channels is represented by $\Delta\lambda$, then the center-to-center distance p between adjacent ones of the photodetectors along the array of the photodetectors satisfies the following equation:

$$p = mf\Delta\lambda/(\alpha d\sqrt{(1-(m\lambda_0/(2d))^2)}).$$

In this arrangement, it is preferable that a plurality of photodetectors matching the shape of a plurality of focused spots corresponding to demultiplexed channels be combined to perform an operation equivalent to a desired large photodetector, for thereby electrically correcting an abaxial aberration. Therefore, the number of photodetectors in the array thereof should preferably be at least α times (α≧2 through 5) the number of demultiplexed channels in the direction in which the light beam is demultiplexed by said diffraction grating. Though there are no limitations on the number of photodetectors particularly in the direction perpendicular to the direction in which the channels are demultiplexed, since minute photodetectors are combined for use as a large photodetector, the number of photodetectors should preferably be the same as in the direction in which the channels are demultiplexed, or at least 2 and at most α.

The optical demultiplexer according to the present invention has at least an optical fiber, a single collimator lens, a diffraction grating, and an array of photodetectors. Since the array of photodetectors is employed, the optical fiber and each one of the photodetectors do not need to be individually encased in a sealed package. As a result, the optical demultiplexer can be reduced in size and cost. Furthermore, the photodetectors have an effective light detecting surface whose width in the direction perpendicular to the array of photodetectors is greater than its width along the array of photodetectors. Therefore, an abaxial aberration caused by an optical system is not corrected by a special design incorporated in the optical system, but is coped with as much as possible by arranging the array of photodetectors in order to accommodate beam spots deformed by the aberration.

If the array of photodetectors comprises a matrix of photodetectors, then the number of photodetectors in the array thereof is at least α times ($\alpha \geq 2$, or more preferably $\alpha \geq 5$) the number of demultiplexed channels in the direction in which the light beam is demultiplexed and scattered, and at least 2 and at most α in the direction perpendicular to the direction in which the light beam is demultiplexed. Consequently, when an input light beam is demultiplexed into a plurality of light beams and the light beams are deformed by an abaxial aberration, deformed focused beam spots are projected onto auxiliary arrays of photodetectors which substantially accommodate all the deformed focused beam spots. The auxiliary arrays of photodetectors are realized within the matrix of photodetectors in an arbitrary configuration that can desirably match the shape of the deformed beam spots. As a result, the optical demultiplexer has a low coupling loss.

BRIEF DESCRIPTION OF THE DRAWINGS

FIG. 2b is an enlarged view of light detecting surfaces of respective photodetectors shown in FIG. 2a, showing focused beam spots deformed on the light detecting surfaces of the photodetectors due to an abaxial aberration caused when an optical fiber is offset from the photodetector array;

BEST MODE FOR CARRYING OUT THE INVENTION

Preferred embodiments of the present invention will hereinafter be described in detail below with reference to the drawings.

Figure 1:
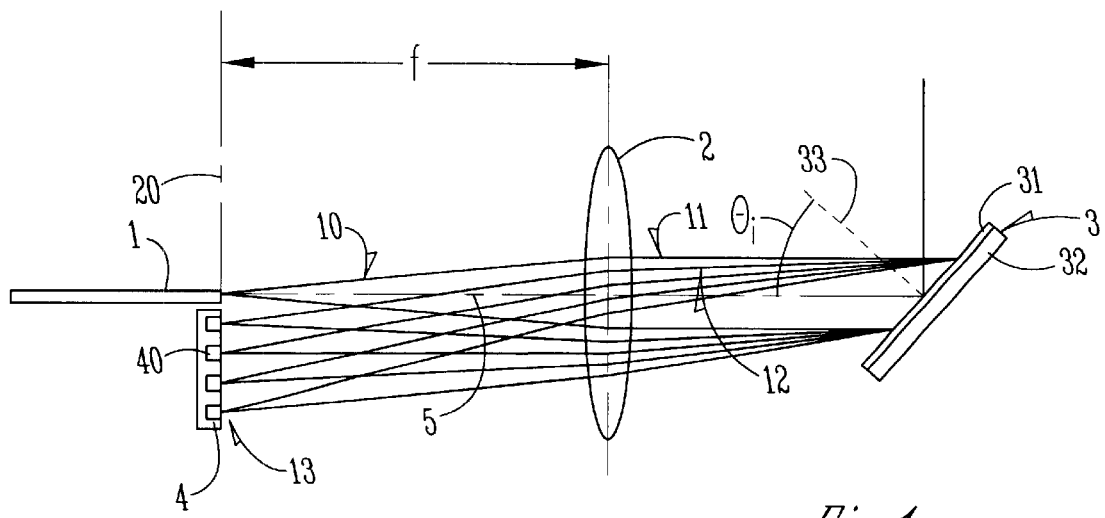
FIG. 1 is a schematic view of an overall 4-channel optical demultiplexer according to a first embodiment of the present invention.

FIG. 1 schematically shows an optical demultiplexer according to a first embodiment of the present invention. In the optical demultiplexer shown in FIG. 1, an optical fiber 1 has an exit surface positioned on a focal plane 20 of a collimator lens 2 on its optical axis. A light beam 10 emitted from the optical fiber 1 spreads depending on the numerical aperture of the optical fiber 1, and is converted by the collimator lens 2 into a parallel beam 11, which is applied to a diffraction grating 3. The diffraction grating 3 comprises a reflective diffraction grating 32 covered with a reflective coating 31. The diffraction grating 3 separates the applied beam 11 and reflects light beams in respective channels depending on its chromatic dispersion characteristics. It is assumed that the diffraction grating 3 has a diffraction order of m and a diffraction constant d, the used wavelength is represented by $\lambda_0$, and an angle formed between a normal 33 to the plane of the diffraction grating 3 and an optical axis 5 is represented by $\theta_1$ and the diffraction grating 3 is positioned to satisfy the equation: $\sin \theta = -m\lambda_0/(2d)$ so that light having the wavelength $\lambda_0$ travels back along the optical axis 5. With the diffraction grating 3 thus positioned, reflected light beams 12 keep their angles with respect to the optical axis 5 depending on the chromatic dispersion, and reach the collimator lens 2 again. The collimator lens 2 focuses the light beams 12 separately on the focal plane 20 off the axis of the collimator lens 2, forming a group of focused beam spots 13 in the respective channels. A photodetector array 4 is disposed on the focal plane 20. The photodetector array 4 comprises photodetectors (effective light detecting surfaces thereof) 40 corresponding respectively to the focused beam spots 13 and arranged in a linear array. In the first embodiment, the number of photodetectors of the photodetector array 4 is the same as the number of demultiplexed channels. In FIG. 2, the light is demultiplexed into four channels.

It is assumed that the center-to-center distance (pitch) between adjacent ones of the photodetectors 40 in the direction in which the focused beam spots 13 are arrayed on the photodetectors is represented by p, the focal length of the collimator lens 2 is represented by f, and the wavelength interval between demultiplexed channels is represented by Δλ. If the following equation (1) is satisfied:

$$p = mf\Delta\lambda/(d\sqrt{(1-(m\lambda_0/(2d)^2)}) \tag{1}$$

then since the center-to-center distance (pitch) between adjacent ones of the focused spots in the demultiplexed channels is equal to the pitch p of the photodetectors 40, good coupling characteristics can be attained simply by effecting alignment adjustment in two channels of used wavelengths, i.e., a channel of the shortest wavelength and a channel of the longest wavelength.

Particularly, the width of the photodetectors 40 in a direction along their array affects the tolerance of an excessive loss with respect to crosstalk and misalignment with adjacent channels, and the width of the photodetectors 40 in a direction perpendicular to their array is influential in reducing a coupling loss with focused beam spots deformed by an abaxial aberration. For example, the optical fiber 1 is offset from the photodetector array 4 in the direction perpendicular to the array of the photodetectors 40 for the reason of a sealing package of the photodetector array 4 (see FIG. 2a). In this offset optical system, when the light beam emitted from the optical fiber 1 is separated into light beams, and the light beams are converged onto the surface of the photodetector array 4, the light beams are subjected to an abaxial aberration which is primarily coma, and form respective focused beam spots elongated in the direction perpendicular to the photodetector array 4 (see FIG. 2b). In order to cancel the effect of the abaxial aberration, it is preferable to tune the width of the photodetectors 40 in the direction perpendicular to their array according to the ratio of vertical to horizontal dimensions of the focused beam spots. In general optical systems, the offset ranges from several mm to slightly less than 10 mm.

Figure 2A:
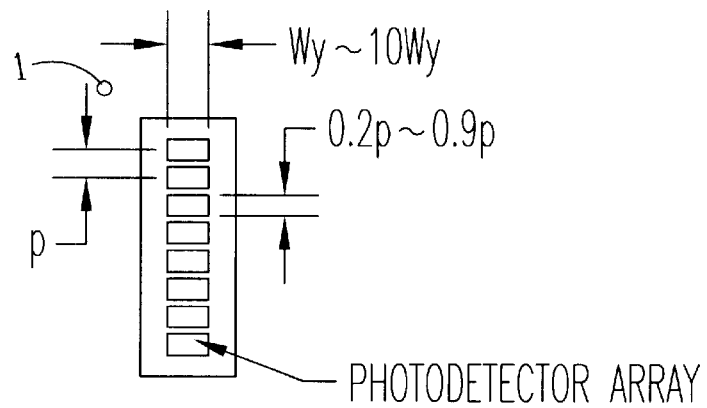
FIG. 2a is a plan view of an 8-channel structure for a photodetector array shown in FIG. 1.
Figure 2C:
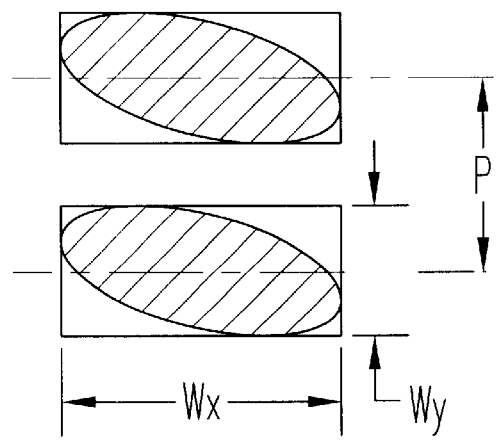
FIG. 2c is a diagram illustrative of dimensions Wy, Wx of the light detecting surfaces of photodetectors shown in FIG. 2b and a center-to-center distance p between the adjacent light detecting surfaces.

In view of the above characteristics, the width Wy of the photodetectors 40 in the direction along their array may range from 0.2 p to 0.9 p, preferably from 0.4 p to 0.6 p, and the width Wx of the photodetectors 40 in the direction perpendicular to their array may range from 1 Wy to 10 Wy, preferably from 3 Wy to 5 Wy (see FIG. 2c).

FIGS. 2a–2c show in plan an 8-channel photodetector array which is different from the photodetector array shown in FIG. 1. The specific details of the 8-channel photodetector array are set forth as follows:

Optical fiber: core diameter=9 µm, numerical aperture= 0.1, single mode

Collimator lens: aperture=20 mm, focal length=50 mm

Input light: wavelength range=1550–1561.2 nm, the number of channels=8, wavelength interval=1.6 nm Diffraction grating: size=25 mm on each square side, diffraction order=primary, diffraction constant d=1.8 µm Photodetector array: ETX100MLA manufactured by EPITAXX, 22pin-DIP package, active element size= 100×30 µm$^2$, center-to-center distance p between photodetectors=50 µm (see FIG. 2b).

Figure 3:
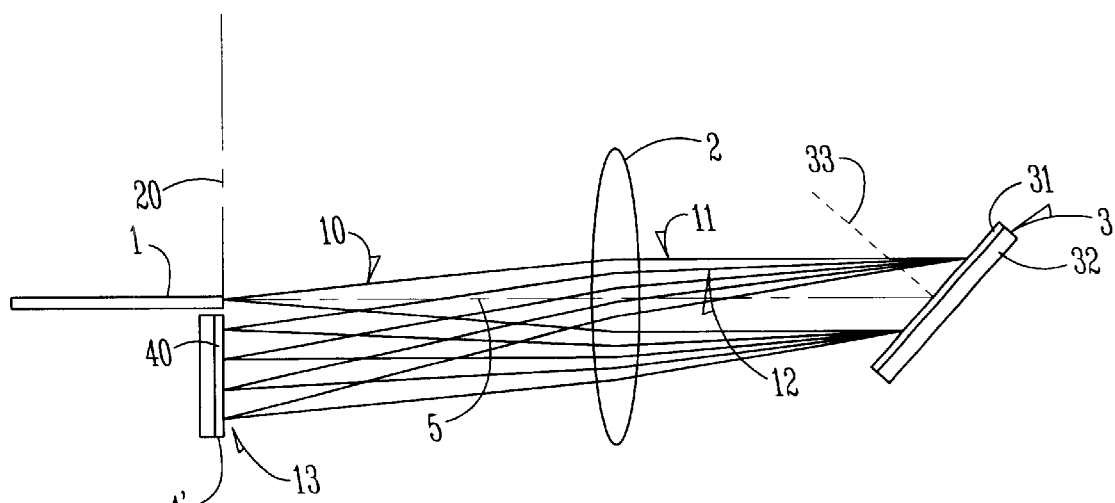
FIG. 3 is a schematic view of an overall 4-channel optical demultiplexer according to a second embodiment of the present invention.

An optical demultiplexer according to a second embodiment of the present invention is schematically shown in FIG. 3. The optical demultiplexer according to the second embodiment is of substantially the same structure as the optical demultiplexer according to the first embodiment shown in FIG. 1. As shown in FIG. 3, the optical demultiplexer according to the second embodiment has an optical fiber 1 on a focal plane 20, a collimator lens 2, and a diffraction grating 3 which are disposed on an optical axis 5, and a photodetector array 4' positioned on the focal plane 20 where light beams separated and focused by the collimator lens 2 form a group of focused beam spots 13. As with the first embodiment, if the diffraction grating 3 is positioned to cause diffracted light having a wavelength $\lambda_0$, and a diffraction order m to travel back along the optical axis 5, then reflected light beams 12 keep their angles with respect to the optical axis 5 depending on the chromatic dispersion, and reach the collimator lens 2 again. The collimator lens 2 focuses the light beams 12 separately on the focal plane 20 off the axis of the collimator lens 2, forming a group of focused beam spots 13 on the photodetector array 4'. Particularly, the optical demultiplexer according to the second embodiment is characterized by the photodetector array 4'. Specifically, the number of photodetectors of the photodetector array is at least α times ($\alpha \geq 2$ or more preferably $\alpha \geq 5$) the number of demultiplexed channels in the direction in which the light beam is demultiplexed by the diffraction grating, and at least 2 and at most α in the direction perpendicular to the direction in which the light beam is demultiplexed by the diffraction grating. If it is assumed that the diffraction grating 3 has a diffraction order of m and a diffraction constant d, the center-to-center distance between adjacent ones of the photodetectors along the array of the photodetectors is represented by p, the focal length of the collimator lens is represented by f, the used wavelength is represented by $\lambda_0$, and the wavelength interval between demultiplexed channels is represented by $\Delta\lambda$, then the center-to-center distance p between adjacent ones of the photodetectors along the array of the photodetectors satisfies the following equation (2):

$$p = mf\Delta\lambda/(\alpha d\sqrt{\sqrt{(1-(m\lambda_0/(2d)^2)}}) \qquad (2)$$

Figure 4A:
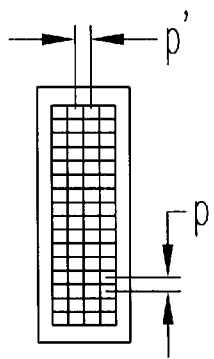
FIG. 4a is a plan view of an 8-channel structure for a photodetector array shown in FIG. 3.

In this embodiment, α should be at least 2 or preferably at least 5, so that a plurality of photodetectors matching the shape of a plurality of focused spots corresponding to demultiplexed channels can be combined to perform an operation equivalent to a desired large photodetector, for thereby electrically correcting an abaxial aberration. Though there are no limitations on the number of photodetectors particularly in the direction perpendicular to the direction in which the channels are demultiplexed, since minute photodetectors are combined for use as a large photodetector, the number of photodetectors should preferably be the same as in the direction in which the channels are demultiplexed. FIG. 4a shows in plan a matrix of photodetectors for 8-channel demultiplexing. In the illustrated embodiment, the number of photodetectors arrayed in the direction in which the diffraction grating demultiplexes the light beam is twice (16 rows) the number of demultiplexed channels, and the number of photodetectors arrayed in the direction perpendicular to the direction in which the channels are demultiplexed is 4. In the matrix of photodetectors, photodetectors to be assigned to each channel should preferably be determined in order to accommodate a deformed focused beam spot. Specifically, the assigned photodetectors comprise an auxiliary array of some photodetectors within the matrix of photodetectors. Focused beam spots demultiplexed from the input light beam and deformed due to an abaxial aberration are projected in a scattered pattern onto the matrix of photodetectors, and detected by the respective auxiliary arrays of photodetectors which substantially accommodate the respective deformed beam spots. The auxiliary arrays of photodetectors are realized within the matrix of photodetectors in an arbitrary configuration that can desirably match the shape of the deformed beam spots. Since the auxiliary arrays of photodetectors can substantially accommodate all the projected deformed beam spots without missing any part thereof, they can achieve a low coupling loss.

Figure 4B:
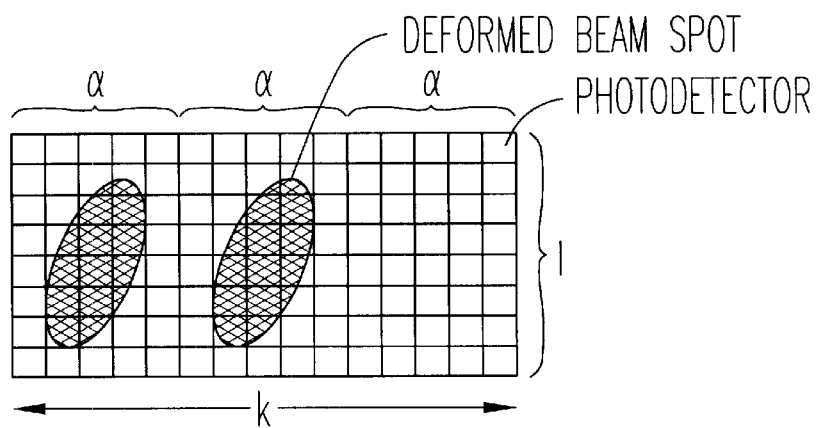
FIG. 4b is a plan view showing the manner in which focused beam spots subjected to an abaxial aberration are projected onto auxiliary arrays of photodetectors which comprises an arbitrary number of photodetectors in a matrix of photodetectors.
Figure 4C:
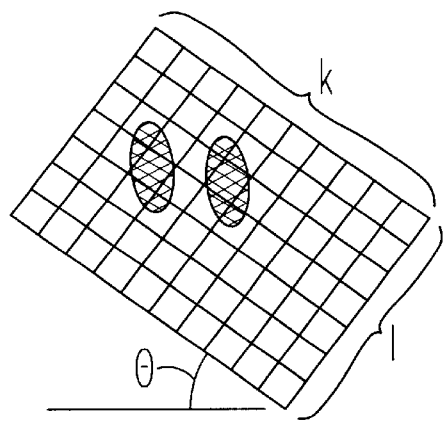
FIG. 4c is a plan view of the matrix of photodetectors shown in FIG. 4b which is inclined in its entirety at an angle θ to light is demultiplexed and scattered.

FIG. 4b is a detailed view of a portion of a matrix (1 rows×k columns) of photodetectors 40, and shows the manner in which focused beam spots are projected onto auxiliary arrays of photodetectors in a matrix of photodetectors. The present invention is not limited to the arrangement shown in FIG. 4b in which the matrix of photodetectors is disposed parallel to the direction in which the input light beam is demultiplexed and scattered, but is applicable to the arrangement shown in FIG. 4c in which the matrix of photodetectors is inclined at an angle θ to the direction in which the light beam is demultiplexed and scattered. In order to enable the auxiliary arrays of photodetectors in the matrix of photodetectors to accommodate respective deformed beam spots, the pitch at which the deformed beam spots and the matrix pitch are equalized to each other within the inclined matrix of photodetectors. If the number of demultiplexed channels in the direction in which the light beam is demultiplexed by the diffraction grating is represented by n, then α is defined as $\alpha = (k \cdot \cos\theta)/n$ (as shown in FIG. 4, θ represents an angle formed between the direction in which the light beam is demultiplexed and scattered and the direction of the k columns). If $(k \cdot \cos\theta)/n$ is a decimal, then a is represented by its integral part by way of approximation. The angle θ should preferably be such an angle that $(k \cdot \cos\theta)/n$ is an integer.

INDUSTRIAL APPLICABILITY

The optical demultiplexer according to the present invention employs an array of photodetectors arranged to accommodate all focused beam spots that have been deformed by an aberration, for achieving an excellent low coupling loss and high demultiplexing performance.

What is claimed is:

1. An optical demultiplexer, comprising:
   an optical fiber,
   a single collimator lens,
   a diffraction grating, and
   an array of photodetectors,
   wherein a light beam emitted from the optical fiber is demultiplexed by the collimator lens and the diffraction grating into light beams, and the light beams are focused by the collimator lens as beam spots deformed due to an aberration of an optical system of the optical demultiplexer onto the array photodetectors, and
   said photodetectors are arranged to accommodate and detect all the deformed focused beam spots, and
   wherein said array of photodetectors comprises a linear array of as many photodetectors as the number of demultiplexed channels in a direction in which the light beam is demultiplexed by said diffraction grating, and said diffraction grating has a diffraction order of m and a diffraction constant d, the center-to-center distance between adjacent ones of said photodetectors along the array of the photodetectors is represented by p, the focal length of said collimator lens is represented by f, the used wavelength is represented by $\lambda_0$, and the wavelength interval between the demultiplexed channels is represented by $\Delta\lambda$, then the center-to-center distance p between adjacent ones of the photodetectors along the array of the photodetectors satisfies the following equation:

$$p = \frac{mf\Delta\lambda}{d\sqrt{1-\left(\frac{m\lambda_0}{(2d)^2}\right)}}.$$

and wherein the width Wy of said photodetectors along the array thereof ranges from 0.2 to 0.9 p and the width Wx of said photodetectors in a direction perpendicular to the array thereof ranges from 1 Wy to 10 Wy.

2. An optical demultiplexer according to claim 1, wherein said width Wy ranges from 0.4 p to 0.6 p and said width Wx ranges from 3 Wy to 5 Wy.

3. An optical demultiplexer, comprising:
   an optical fiber,
   a single collimator lens,
   a diffraction grating, and
   an array of photodetectors,
   wherein a light beam emitted from the optical fiber is demultiplexed by the collimator lens and the diffraction grating into light beams, and the light beams are focused by the collimator lens as beam spots deformed due to an aberration of an optical system of the optical demultiplexer onto the array photodetectors, and
   said photodetectors are arranged to accommodate and detect all the deformed focused beam spots, and
   wherein said array of photodetectors comprises a matrix of photodetectors in 1 rows×k columns, and the number of demultiplexed channels in the direction in which the light beam is demultiplexed by said diffraction grating is represented by n, then $\alpha$ is defined as $\alpha=(k\cdot\cos\theta)/n$, $\theta$ represents an angle formed between the direction in which the light beam is demultiplexed and scattered and the direction of the k columns, and wherein said diffraction grating has a diffraction order of m and a diffraction constant d, the center-to-center distance between adjacent ones of said photodetectors along the array of the photodetectors is represented by p, the focal length of said collimator lens is represented by f, the used wavelength is represented by $\lambda_0$, and the wavelength interval between the demultiplexed channels is represented by $\Delta\lambda$, then the center-to-center distance p between adjacent ones of the photodetectors along the array of the photodetectors satisfies the following equation:

$$p = \frac{mf\Delta\lambda}{\alpha d\sqrt{1-\left(\frac{m\lambda_0}{(2d)^2}\right)}}.$$

4. An optical demultiplexer according to claims 3, wherein the number of photodetectors in the array thereof is at least $\alpha$ times the number of demultiplexed channels in the direction in which the light beam is demultiplexed by said diffraction grating, and wherein $\alpha$ is greater than or equal to 2.

5. An optical demultiplexer according to claim 3, wherein the number of photodetectors in the array thereof is at least 2 and at most $\alpha$ in the direction perpendicular to the direction in which the light beam is demultiplexed by said diffraction grating.

6. An optical demultiplexer according to claim 3, wherein the number of photodetectors in the array thereof is at least $\alpha$ times the number of demultiplexed channels in the direction in which the light beam is demultiplexed by the diffraction grating, and wherein $\alpha$ is greater than or equal to 5.

7. An optical demultiplexer, comprising:
   a plurality of photodetectors; and
   optical means for demultiplexing a light beam into a plurality of light beams focused on the plurality of photodetectors, wherein the plurality of light beams are deformed by aberrations through the optical means;
   wherein the plurality of photodetectors provide aberration-correction means by substantially detecting all of each of the plurality of light beams experiencing aberrations;
   wherein said optical means includes a diffraction grating having a diffraction order of "m" and a diffraction constant of "d", the optical means includes a collimator lens having a focal length of "f", a wavelength of $\lambda_0$, and a wavelength interval between demultiplexed channels of "$\Delta\lambda$", and then a center-to-center distance "p" between adjacent ones of the photodetectors satisfies the following equation:

$$p = \frac{mf\Delta\lambda}{d\sqrt{1-\left(\frac{m\lambda_0}{(2d)^2}\right)}}.$$

8. The optical demultiplexer according to claim 7, wherein a width Wy of each said photodetector ranges from 0.2 to 0.9 p and a width Wx of each said photodetectors in a direction perpendicular to the width Wy ranges from 1 Wy to 10 Wy.

9. The optical demultiplexer according to claim 8, wherein the width Wy ranges from 3 Wy to 5 Wy.

10. The optical demultiplexer according to claim 7, wherein a width Wy of each said photodetector ranges from 0.4 to 0.6 p.

11. The optical demultiplexer according to claim 10, wherein a width Wx of each said photodetectors in a direction perpendicular to the width Wy ranges from 1 Wy to 10 Wy.

12. The optical demultiplexer according to claim 10, wherein a width Wx of each said photodetectors in a direction perpendicular to the width Wy ranges from 3 Wy to 5 Wy.

13. The optical demultiplexer according to claim 7, wherein the the plurality of photodetectors includes a two dimensional array of photodetectors, the two dimensional array having "l" rows and "k" columns.

14. The optical demultiplexer according to claim 3, wherein the number of photodetectors in the "k" columns is at least 2 for each demultiplexed light beam.

15. The optical demultiplexer according to claim 3, wherein the number of photodetectors in the "k" columns is at least 5 for each demultiplexed light beam.

16. The optical demultiplexer according to claim 3, wherein the number of photodetectors in the "l" rows is at least two, and the "l" rows are arranged perpendicular to a direction in which the light beam is demultiplexed.

17. The optical demultiplexer according to claim 3, wherein the optical means includes a diffraction grating and a collimator lens,
   wherein a number of demultiplexed channels in a direction in which the light beam is demultiplexed by the optical means is "n", "α" is defined as α=(k·cos θ)/n, where θ represents an angle formed between the direction in which the light beam is demultiplexed and a direction of the k columns,
   wherein the diffraction grating has a diffraction order of "m" and a diffraction constant of "d",
   wherein the center-to-center distance between adjacent ones of the photodetectors is "p", the focal length of the collimator lens is "f", a used wavelength is "$\lambda_0$", and a wavelength interval between demultiplexed channels is "$\Delta\lambda$", then the center-to-center distance "p" satisfies the following equation:

$$p = \frac{mf\Delta\lambda}{\alpha d \sqrt{1 - \left(\frac{m\lambda_0}{(2d)^2}\right)}}.$$

18. The optical demultiplexer according to claim 17, wherein the number of photodetectors in the array thereof is at least α times the number of demultiplexed channels of light beams in the direction in which the light beam is demultiplexed by the diffraction grating, and wherein α≧2 through 5.

19. The optical demultiplexer according to claim 17, wherein the number of photodetectors in the array thereof is at least 2 and at most α in the direction perpendicular to the direction in which the light beam is demultiplexed by the diffraction grating.

* * * * *

UNITED STATES PATENT AND TRADEMARK OFFICE
CERTIFICATE OF CORRECTION

PATENT NO. : 6,373,606 B1
DATED : April 16, 2002
INVENTOR(S) : Nakama et al.

It is certified that error appears in the above-identified patent and that said Letters Patent is hereby corrected as shown below:

<u>Title page,</u>
Item [56], FOREIGN PATENT DOCUMENTS, delete "G02B/2/293" and insert -- G02B/6/293 --, therefor.
Item [56], OTHER PUBLICATIONS,
Delete "Electronics" and insert -- Electronic --, therefor.
Delete "Musahiro" and insert -- Masahiro --, therefor.

<u>Column 2,</u>
Line 28, delete "$p=mf\Delta\lambda/(d\sqrt{(1-(m\lambda_0/(2d)^2)}$" and insert -- $p=mf\Delta\lambda/(d\sqrt{(1-(m\lambda_0/(2d)^2)}$ --, therefor.
Line 54, delete "$p=mf\Delta\lambda/(\alpha d\sqrt{(1-(m\lambda_0/(2d)^2)}$" and insert -- $p=mf\Delta\lambda/(\alpha d\sqrt{(1-(m\lambda_0/(2d)^2)}$ --, therefor.

<u>Column 4,</u>
Line 18, after "$\theta_1$" insert -- , --.
Line 19, delete "sin $\theta$" and insert -- $sin\theta_1$ --, therefor.

Line 43, delete "$p=mf\Delta\lambda/(d\sqrt{(1-(m\lambda_0/(2d)^2)}$" and insert -- $p=mf\Delta\lambda/(d\sqrt{(1-(m\lambda_0/(2d)^2)}$ --, therefor.

<u>Column 6,</u>
Line 5, delete "$p=mf\Delta\lambda/(\alpha d\sqrt{(1-(m\lambda_0/(2d)^2)}$" and insert -- $p=mf\Delta\lambda/(\alpha d\sqrt{(1-(m\lambda_0/(2d)^2)}$ --, therefor.

<u>Column 7,</u>
Line 66, delete "$\theta$ represents an angle formed between the direction in which the light beam is demultiplexed and scattered and the direction of the k columns,".

UNITED STATES PATENT AND TRADEMARK OFFICE
CERTIFICATE OF CORRECTION

PATENT NO. : 6,373,606 B1
DATED : April 16, 2002
INVENTOR(S) : Nakama et al.

It is certified that error appears in the above-identified patent and that said Letters Patent is hereby corrected as shown below:

Column 9,
Line 13, delete "claim 3" and insert -- claim 13 --, therefor.
Line 16, delete "claim 3" and insert -- claim 13 --, therefor.
Line 19, delete "claim 3" and insert -- claim 13 --, therefor.
Line 23, delete "claim 3" and insert -- claim 13 --, therefor.

Signed and Sealed this

Twenty-ninth Day of October, 2002

*Attest:*

*Attesting Officer*

JAMES E. ROGAN
*Director of the United States Patent and Trademark Office*